(12) United States Patent
Chen et al.

(10) Patent No.: US 7,039,483 B1
(45) Date of Patent: May 2, 2006

(54) MANUFACTURING MANAGEMENT SYSTEM AND METHOD

(75) Inventors: Philip Chen, Hsinchu (TW); R. L. Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 11/068,618

(22) Filed: Feb. 28, 2005

(51) Int. Cl.
*G06F 19/00* (2006.01)

(52) U.S. Cl. .................. 700/100; 700/97; 700/101; 700/102

(58) Field of Classification Search ............ 700/97, 700/99, 100–102
See application file for complete search history.

(56) References Cited

U.S. PATENT DOCUMENTS

| | | | |
|---|---|---|---|
| 5,446,671 A * | 8/1995 | Weaver et al. | 700/100 |
| 5,751,580 A * | 5/1998 | Chi | 700/101 |
| 5,940,298 A * | 8/1999 | Pan et al. | 700/100 |
| 6,865,433 B1 * | 3/2005 | Burda | 700/101 |

\* cited by examiner

*Primary Examiner*—Leo Picard
*Assistant Examiner*—Sean Shechtman
(74) *Attorney, Agent, or Firm*—Thomas, Kayden, Horstemeyer & Risley

(57) ABSTRACT

A manufacturing management system and method. A processing unit calculates an acceleration capability according to a capacity loss rate for a target fabrication velocity and a number of work pieces under the target fabrication velocity in the production line, and a fabrication acceleration capability according to an original capacity loss rate for an average fabrication velocity and a given number of work pieces under the average fabrication velocity in the production line. The production line is managed according to the acceleration capability and the fabrication acceleration capability.

20 Claims, 3 Drawing Sheets

MANUFACTURING MANAGEMENT SYSTEM AND METHOD

BACKGROUND

The present disclosure relates generally to manufacturing management, and, more particularly, to manufacturing management systems and methods that manage work pieces with various priorities/fabrication velocities.

In product supply, a supply chain supports material purchase, fabrication of materials into intermediate and finished products, and distribution of finished products to clients. Supply chain management has become important in meeting goals of reduced inventory, increased productivity, and enhanced competitiveness. Manufacturing and distribution facilities have limited resources and capacity, however, so not every client request may be met. For example, some requests may be promised but unfulfilled, some clients may experience inadequate supply, and other requests may be rejected. Consequently, effective capacity management in supply chain management, without excess capacity loss, has become important for product suppliers requiring control of manufacture or distribution.

In the supply chain, clients transmit demands to a supplier. Demands may include a request for a particular quantity of a device by a specific date. The supplier forecasts and plans its internal or external manufacturing schedule according to received demands, and allocates capacity for product manufacture to satisfy each client. After receiving orders corresponding to demands from clients, the supplier begins manufacture of the products. Clients sometimes submit pull-in orders, for many reasons, to request that the supplier handling the order to assign it a higher priority. For example, if a client has booked a capacity to fabricate an order of a product in December, but, due to high demand for the product on the market, the client decides to transmit a pull-in order to prioritize the order for delivery in mid-September. The supplier must determine whether to accept the pull-in order. If yes, the supplier promises a reduced cycle time for the corresponding product.

Additionally, on-time delivery is critical to successful supply chain management. As described, if pull-in orders are accepted, other orders are impacted and delayed, making it difficult to provide clients with an exact delivery date. For clients, the uncertainty disrupts transport and inventory planning and management. The situation encourages client pull-in behavior. Since the supplier is unable to deliver the order with a commit date, clients tend to place the pull-in order prior to their original demand to prevent delivery delay. This pull-in behavior can be severely detrimental to the production system because it changes the original demand planning and can cause production disorder when many orders are unexpectedly changed to pull-in status.

Consequently, it is critical to determine whether to accept pull-in orders, and evaluate the impacts of acceptance. There is no model, however, for constructing the relationship between pull-in orders and corresponding impacts, and no mechanism to automatically and systematically control the number of work pieces with various priorities/fabrication velocities. Thus, capacity loss and on-time delivery failure result.

SUMMARY

Embodiments of the invention are applicable to any factory, service supplier, and/or product.

Manufacturing management systems and methods are provided. An exemplary embodiment of a manufacturing management system comprises a request management unit and a processing unit. The request management unit configured to receive at least one request indicating at least one target fabrication velocity for a work piece. The processing unit configured to calculate an acceleration capability for said work piece according to a capacity loss rate corresponding to the target fabrication velocity, and to calculate a fabrication acceleration capability according to an original capacity loss rate based on a given number of work pieces under an average fabrication velocity in the production line.

In an exemplary embodiment of a manufacturing management method, an acceleration capability for a work piece is calculated according to a capacity loss rate corresponding to a target fabrication velocity for said work piece. A fabrication acceleration capability is calculated according to an original capacity loss rate based on a given number of work pieces under an average fabrication velocity in the production line.

Manufacturing management systems and methods may take the form of program code embodied in a tangible media. When the program code is loaded into and executed by a machine, the machine becomes an apparatus for practicing the disclosed method.

DESCRIPTION OF THE DRAWINGS

Manufacturing management systems and methods will become more fully understood by referring to the following detailed description with reference to the accompanying drawings, wherein.

DESCRIPTION

Figure 1:
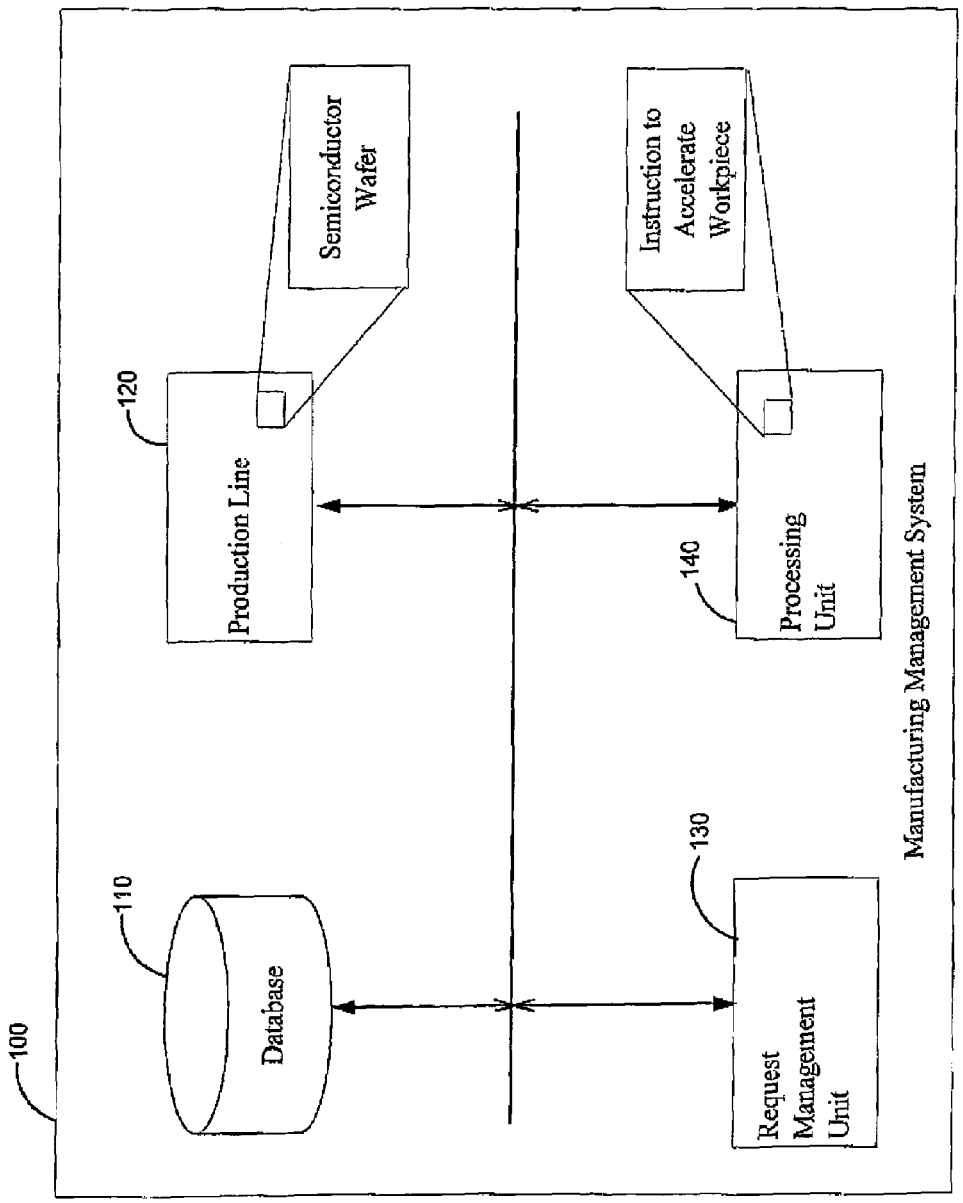
FIG. 1 is a schematic diagram illustrating an embodiment of a manufacturing management system.

FIG. 1 is a schematic diagram illustrating an embodiment of a manufacturing management system. The manufacturing management system is for handling the production of a plurality of work pieces WP. The work pieces WP may be, but not limited to, semiconductor wafers, liquid crystal display panels, electronic apparatuses, PC boards, etc.

The manufacturing management system 100 includes a database 110, a production line 120, a request management unit 130, and a processing unit 140. The production line 120 has a plurality of stages (S1, S2, . . . ,Sn), each comprising at least one equipment tool (E1, E2, . . . , En). The database 10 stores information used by the processing unit 130, such as the theoretical fabrication velocity and average fabrication velocity of the production line 120, the committed fabrication velocity for a respective work piece, and WIP information of the production line 120, such as the total work piece number under a specific fabrication velocity or the work piece number under the specific fabrication velocity. The fabrication velocity is also called cycle time per layer (CTPL) in an IC foundry. The theoretical fabrication velocity is the time that it actually takes to process work pieces WP on equipment (E1, E2, . . . , En) in the production line 120. It is understood that respective work piece may have a corresponding fabrication velocity and a weight, and the average fabrication velocity is calculated according to the fabrication velocity and corresponding weights for work pieces. As an example, a work piece with an urgent delivery date may be assigned a different weight than another work piece with a normal delivery date. The committed fabrication velocity is determined by production control personnel to commit clients. It is understood that a tolerance existed between the average and committed fabrication velocities in order to avoid some emergencies. Additionally, the database 110 may couple to the supply chain management system comprising MES (Manufacturing Execution System), planning system, product database, and others.

The request management unit 130 receives at least one request from clients. Each request may comprise a specific quantity of work pieces/products, and indicate at least one target fabrication velocity that the work pieces requiring handling must meet. For example, the request is a pull-in request if the target fabrication velocity is faster than the committed fabrication velocity. Additionally, the pull-in request can be further divided into Super Hot, Pilot/Hot, and Push work pieces, and each classification has a different target fabrication velocity, representing the degree of urgency. Note that the target fabrication velocities for respective classification can be stored in the database 110 in advance. The processing unit 140 performs the manufacturing management method of an embodiment of the invention. A detailed description thereof follows.

Figure 2:
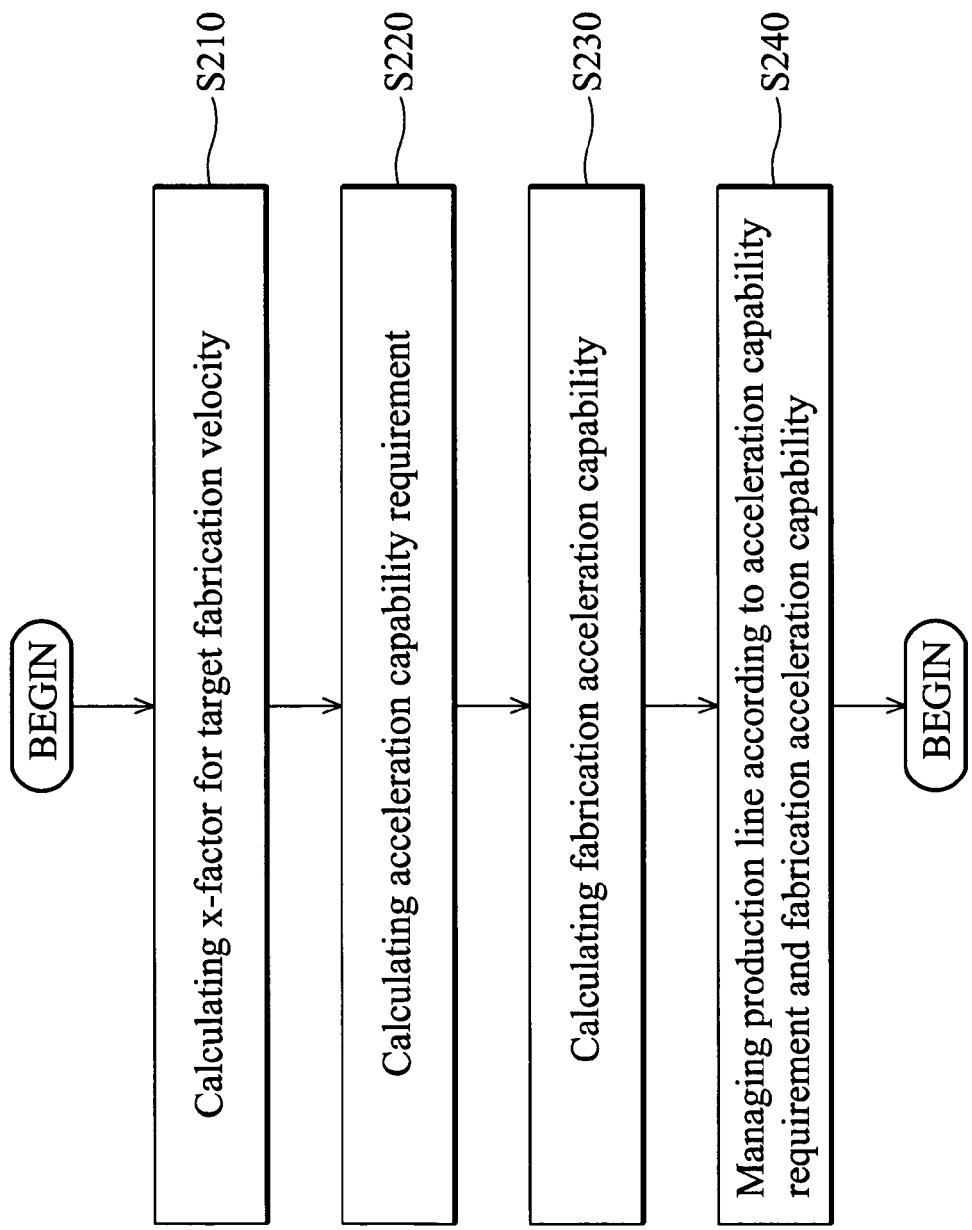
FIG. 2 is a flowchart of an embodiment of a manufacturing management method.

FIG. 2 is a flowchart of an embodiment of a manufacturing management method.

First, in step S210, the processing unit 140 calculates an x-factor for a respective target fabrication velocity according to the target fabrication velocity and a theoretical fabrication velocity using formula (1).

$$x-\text{factor} = \frac{TaFV}{TeFV}, \quad (1)$$

wherein TaFV is the target fabrication velocity, and TeFV is the theoretical fabrication velocity.

Then, in step S220, the processing unit 140 calculates an acceleration capability according to a capacity loss rate for the target fabrication velocity and a number of work pieces under the target fabrication velocity in the production line 120 using formula (2). The acceleration capability is a factor representing the capacity must be further provided from the production line 120 for handling the work pieces under the target fabrication velocity.

$$ACR = CLR_{target} \times LN_{request\_target}, \quad (2)$$

wherein $CLR_{target}$ is the capacity loss rate for the target fabrication velocity, and $LN_{request\_target}$ is the number of work pieces under the target fabrication velocity in the production line 120.

The capacity loss rate for the target fabrication velocity is calculated according to the utilization rate of the production line 120 under the target fabrication velocity, and a given number of work pieces under the target fabrication velocity in the production line 120 using formula (3).

$$CLR_{target} = \frac{1 - U_{target}}{LN_{under\_target}}, \quad (3)$$

wherein $CLR_{target}$ is the capacity loss rate for the target fabrication velocity, $U_{target}$ is the utilization rate of the production line 120 under the target fabrication velocity, and $LN_{under\_target}$ is the number of work pieces under the target fabrication velocity in the production line 120. The utilization rate can be calculated based on the X-factor of the target fabrication velocity, and that of the committed fabrication velocity as a baseline.

Thereafter, in step S230, the processing unit 140 calculates a fabrication acceleration capability according to an original capacity loss rate for an average fabrication velocity and a given number of work pieces under the average fabrication velocity in the production line 120 using formula (4). The fabrication acceleration capability is a factor representing the capacity can be additionally provided by the production line 120.

$$FAC = CLR_{average} \times LN_{under\_average}, \quad (4)$$

wherein $CLR_{average}$ is the original capacity loss rate for the average fabrication velocity, and $LN_{under\_average}$ is the number of work pieces under the average fabrication velocity in the production line 120.

In step S240, the processing unit 140 manages the production line 120 according to the acceleration capability and the fabrication acceleration capability. The fabrication acceleration capability should be always greater than or equal to the acceleration capability, representing the production line 120 can handle work pieces with various target fabrication velocities without failure or delay of on-time delivery. If the fabrication acceleration capability is less than the acceleration capability for the work pieces, the processing unit 140 generates a notification to related personnel, informing some normal work pieces may be impacted and delayed. The processing unit 140 can further determine whether to accept other requests indicating faster fabrication velocities. If the fabrication acceleration capability is greater than the acceleration capability for said work piece, the processing unit 140 can accept other requests or provide an instruction to accelerate said work piece to said target fabrication velocity. It is understood that if another request is received by the request management unit 130, the entire process (S210–S240) should be performed again with the work pieces under a specific fabrication velocity for the request.

It is understood that the X-factors, utilization, work piece number, and capacity loss rate under respective target fabrication velocity can be calculated and stored in the database 110 in advance. For example, the target fabrication velocities (CTPL) for Super Hot, Pilot/Hot, Push, and Normal (average fabrication velocity) work pieces are 0.8, 1.2, 1.5, and 2, the fabrication committed fabrication velocity is 2.1, and the theoretical fabrication velocity is 0.64. In this example, the utilization and total work piece number under respective target fabrication velocity are monitored and obtained from related servers, such as MES. It is understood that the utilization can be also calculated based on the X-factor of the respective target fabrication velocities, and the committed fabrication velocity as a baseline (100%). Table 1 shows the X-factors, utilization, work piece number, and capacity loss rate under respective target fabrication velocities.

TABLE 1

|  | CTPL | X-factor | Utilization | Work piece Number | Capacity Loss Rate |
|---|---|---|---|---|---|
| Super Hot Work piece | 0.8 | 1.25 | 32% | 696 | 0.098% |

TABLE 1-continued

| | CTPL | X-factor | Utilization | Work piece Number | Capacity Loss Rate |
|---|---|---|---|---|---|
| Pilot/Hot Work piece | 1.2 | 1.88 | 60% | 1329 | 0.030% |
| Push Work piece | 1.5 | 2.34 | 76% | 1677 | 0.014% |
| Normal Work piece | 2 | 3.13 | 97% | 2126 | 0.002% |
| Fabrication Committed | 2.1 | 3.28 | 100% | 2200 | 0% |

The maximum fabrication acceleration capability is 2126×0.002%=4.252%, and the total acceleration capability follows:

$$0.098\% \times S\_LN + 0.030\% \times P/H\_LN + 0.014\% \times Push\_LN, \quad (5)$$

wherein S_LN is the number of Super Hot work pieces, P/H_LN is the number of Pilot/Hot work pieces, and Push_LN is the number of Push work pieces. A balance equation FAC≧ACR can be employed to evaluate the planning and management quality, and further to project the delivery quality. It is understood that only three types of pull-in requests are used in this example, the embodiment of the invention, however, can provide several classifications with various fabrication velocities.

Figure 3:
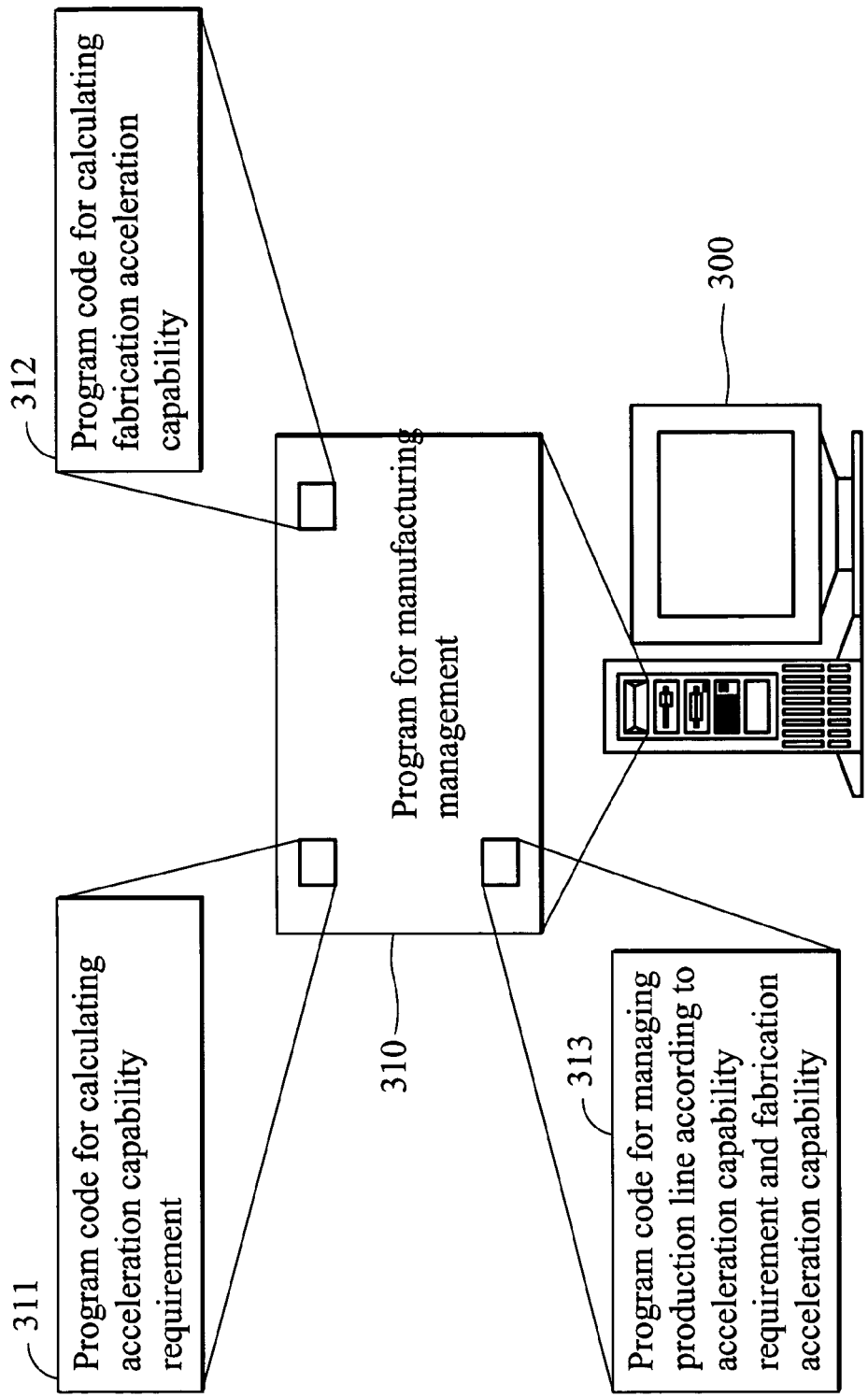
FIG. 3 is a schematic diagram illustrating an embodiment of a storage medium storing a computer program for execution of a manufacturing management method.

FIG. 3 is a schematic diagram illustrating an embodiment of a storage medium storing a computer program for execution of a manufacturing management method. The computer program product comprises a storage medium 310 having computer readable program code embodied in the medium for use in a computer system 300, the computer readable program code comprises at least computer readable program code 311 calculating an acceleration capability according to a capacity loss rate for the target fabrication velocity and a number of work pieces under the target fabrication velocity in the production line, computer readable program code 312 calculating a fabrication acceleration capability according to an original capacity loss rate for an average fabrication velocity and a given number of work pieces under the average fabrication velocity in the production line, and computer readable program code 313 managing the production line according to the acceleration capability and the fabrication acceleration capability.

Manufacturing management systems and methods, or certain aspects or portions thereof, may take the form of program code (i.e., executable instructions) embodied in tangible media, such as products, floppy diskettes, CD-ROMS, hard drives, or any other machine-readable storage medium, wherein, when the program code is loaded into and executed by a machine, such as a computer or a device comprising a mobile phone, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine, such as a computer or a device comprising a mobile phone, the machine becomes an apparatus for practicing the disclosed methods. When implemented on a general-purpose processor, the program code combines with the processor to provide a unique apparatus that operates analogously to application specific logic circuits.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A manufacturing management system for a production line, comprising:
   a request management unit configured to receive at least one request indicating at least one target fabrication velocity for a specific work piece; and
   a processing unit configured
   to calculate a first acceleration capability for the specific work piece according to a first capacity loss rate corresponding to the target fabrication velocity, and
   to calculate a second fabrication acceleration capability according to a second original capacity loss rate, in which the second original capacity loss rate is based on a given number of work pieces, and the work pieces are under an average fabrication velocity in the production line.

2. The system of claim 1 wherein the processing unit further calculates the first capacity loss rate for the target fabrication velocity according to utilization rate of the production line under the target fabrication velocity for a given number of work pieces.

3. The system of claim 2 wherein the processing unit calculates the first capacity loss rate for the target fabrication velocity according to:

$$CLR_{target} = \frac{1 - U_{target}}{LN_{under\_target}},$$

wherein $CLR_{target}$ is the first capacity loss rate for the target fabrication velocity, $U_{target}$ is the utilization rate of the production line under the target fabrication velocity, and $LN_{under\_target}$ is the number of work pieces under the target fabrication velocity in the production line.

4. The system of claim 1 wherein the processing unit calculates the first acceleration capability for one or more work pieces according to:

$$ACR = CLR_{target} \times LN_{request\_target},$$

wherein ACR is the acceleration capability, $CLR_{target}$ is the first capacity loss rate for the target fabrication velocity, and $LN_{request\_target}$ is the number of work pieces under the target fabrication velocity in the production line.

5. The system of claim 1 wherein the processing unit calculates the second fabrication acceleration capability according to:

$$FAC = CLR_{average} \times LN_{under\_average},$$

wherein FAC is the fabrication acceleration capability, $CLR_{average}$ is the original capacity loss rate for the average fabrication velocity, and $LN_{under\_average}$ average is the number of work pieces under the average fabrication velocity in the production line.

6. The system of claim 1 wherein the processing unit further determines whether to accept the request according to the first acceleration capability for the specific work piece and the second fabrication acceleration capability.

7. The system of claim 6 wherein the processing unit further provides an instruction to accelerate the specific work piece to said target fabrication velocity if the second fabrication acceleration capability is greater than the first acceleration capability for the specific work piece.

8. The system of claim 1 wherein the processing unit further generates a notification if the second fabrication acceleration capability is less than the first acceleration capability for the specific work piece.

9. The system of claim 1 wherein the specific work piece is a semiconductor wafer.

10. A manufacturing management method for a production line, comprising:
    calculating a first acceleration capability for a specific work piece according to a first capacity loss rate corresponding to a target fabrication velocity for the specific work piece; and
    calculating a second fabrication acceleration capability according to a second original capacity loss rate, in which the second original capacity loss rate is based on a given number of work pieces, and the work pieces are under an average fabrication velocity in the production line.

11. The method of claim 10 further comprising calculating the first capacity loss rate for the target fabrication velocity according to utilization rate of the production line under the target fabrication velocity for a given number of work pieces.

12. The method of claim 11 further comprising calculating the first capacity loss rate for the target fabrication velocity according to:

$$CLR_{target} = \frac{1 - U_{target}}{LN_{under\_target}},$$

wherein $CLR_{target}$ is the first capacity loss rate for the target fabrication velocity, $U_{target}$ is the utilization rate of the production line under the target fabrication velocity, and $LN_{under\_target}$ is the number of work pieces under the target fabrication velocity in the production line.

13. The method of claim 10 further comprising calculating the first acceleration capability for one or more work pieces according to:

$$ACR = CLR_{target} \times LN_{request\_target},$$

wherein ACR is the acceleration capability, $CLR_{target}$ is the first capacity loss rate for the target fabrication velocity, and $LN_{request\_target}$ is the number of work pieces under the target fabrication velocity in the production line.

14. The method of claim 10 further comprising calculating the second fabrication acceleration capability according to:

$$FAC = CLR_{average} \times LN_{under\_average},$$

wherein FAC is the fabrication acceleration capability, $CLR_{average}$ is the second original capacity loss rate for the average fabrication velocity, and $LN_{under\_average}$ is the number of work pieces under the average fabrication velocity in the production line.

15. The method of claim 10 further comprising: instructing to accelerate the specific work piece to said target fabrication velocity if the second fabrication acceleration capability is greater than the first acceleration capability for the specific work piece.

16. The method of claim 10 further comprising generating a notification if the second fabrication acceleration capability is less than the first acceleration capability for the specific work piece.

17. The method of claim 10 wherein the specific work piece is a semiconductor wafer.

18. A tangible machine-readable storage medium storing a computer program, which, when executed, causes a computer to perform a manufacturing management method for a production line, the method comprising:
    calculating a first acceleration capability for a specific work piece according to a first capacity loss rate corresponding to a target fabrication velocity for the specific work piece; and
    calculating a second fabrication acceleration capability according to a second original capacity loss rate, in which the second original capacity loss rate is based on a given number of work pieces, and the work pieces are under an average fabrication velocity in the production line.

19. A manufacturing management system for a production line, comprising:
    a processor operative to calculate a first acceleration capability for a specific work piece according to a first capacity loss rate corresponding to a target fabrication velocity for the specific work piece, and to calculate a second fabrication acceleration capability according to a second original capacity loss rate, in which the second original capacity loss rate is based on a given number of work pieces, and the work pieces are under an average fabrication velocity in the production line; and
    means for issuing an instruction to the production line according to the first acceleration capability and the second fabrication acceleration capability.

20. The system of claim 19 wherein the specific work piece is a semiconductor wafer.

* * * * *